United States Patent

Yamamoto et al.

[15] 3,657,610

[45] Apr. 18, 1972

[54] SELF-SEALING FACE-DOWN BONDED SEMICONDUCTOR DEVICE

[72] Inventors: Hirohiko Yamamoto; Masamichi Shiraishi, both of Tokyo, Japan

[73] Assignee: Nippon Electric Company, Limited, Tokyo, Japan

[22] Filed: June 24, 1970

[21] Appl. No.: 49,441

[30] Foreign Application Priority Data

July 10, 1969 Japan ....................................44/54891

[52] U.S. Cl. ..............................................317/234, 317/101

[51] Int. Cl. ..............................................H01l 5/02

[58] Field of Search ...............317/234, 238 E, 238 T, 238 G; 174/152 H

[56] References Cited

UNITED STATES PATENTS

| | | | |
|---|---|---|---|
| 3,335,336 | 8/1967 | Urushida et al. | 317/234 |
| 3,386,016 | 5/1968 | Lindmayer | 317/235 |
| 3,397,278 | 8/1968 | Pomerantz | 174/152 |
| 3,543,106 | 11/1970 | Kern | 317/235 |

*Primary Examiner*—James D. Kallam

*Attorney*—Sandoe, Hopgood and Calimafde

[57] ABSTRACT

In a self-sealing semiconductor device of the face-down bonding type, a plurality of electrode bumps are formed on one surface of semiconductor substrate and surrounded by a sealing projection of substantially uniform height.

11 Claims, 8 Drawing Figures

Figure 1A:
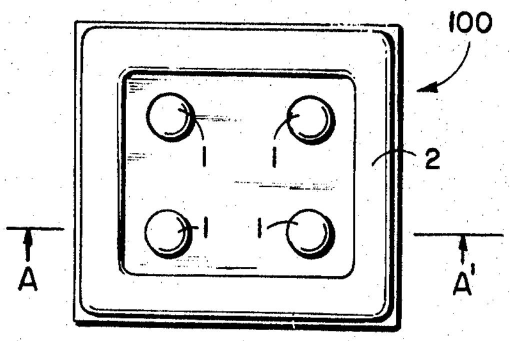

INVENTORS
HIROHIKO YAMAMOTO
MASAMICHI SHIRAISHI by
Sandoe, Hopgood & Calimafde
ATTORNEYS

*INVENTORS*
HIROHIKO YAMAMOTO
MASAMICHI SHIRAISHI
*by*
Sandoe, Hopgood & Calimafde
ATTORNEYS

SELF-SEALING FACE-DOWN BONDED SEMICONDUCTOR DEVICE

This invention relates generally to semiconductor devices, and more particularly to an improved semiconductor device of the face-down bonding type.

The conventional semiconductor devices of the face-down bonded type have a plurality of electrode bumps formed on a major surface of the semiconductor device. These electrode bumps are directly bonded to respective bonding portions of metallic circuit patterns formed on an insulator substrate.

Since the semiconductor device thus bonded may be impaired by moisture or the ambient atmosphere in itself, a hermetical seal must be provided for the face-down bonded semiconductor device. Resin-molding is one of the most simple and inexpensive ways to achieve such a heremetic seal. However, this process cannot be applied to a face-down bonded semiconductor device, because the molten resin tends to penetrate into the gap formed between the semiconductor device and the substrate and adversely affect the major face of the device. Therefore, a ceramic cap has been usually employed for hermetically sealing face-down bonded semiconductor devices.

This technique, however, increases the number of steps required in the manufacturing process increases, because the ceramic cap must be placed on the substrate to cover the device after the face-down bonding of the device and then hermetically sealed with the substrate. As a result, the manufacturing cost is appreciably high and the area that one device occupies on the substrate is of necessity large. Moreover, the electrical contact with the back face of the device tends to be unstable and, dissipation of heat generated in the device is impeded.

Accordingly, it is an object of this invention to provide an inexpensive and highly reliable semiconductor device of the face-down bonding type which is capable of preventing moisture, resin or the like from penetrating into the gap between the semiconductor device and the substrate without employing a sealing cap or case.

It is another object of this invention to provide a semiconductor device of the face-down bonding type which permits electrodes to be easily attached to the back surface of the device.

It is a further object of this invention to provide a face-down bonding type semiconductor device which affords excellent heat dissipation.

According to the present invention, there is provided a self-sealing semiconductor device in which a plurality of electrode bumps and a sealing projection of uniform height are formed on a major surface of the semiconductor device. The sealing projection is made of a metallic material such as gold, silver, tin, lead or alloys of two or more of these metals, or an insulative material such as silicon oxide or low-melting point glass, and disposed at the edge of said surface of the semiconductor device so as to surround the electrode bumps either individually or in a group.

The semiconductor device according to this invention can hermetically seal the electrode bumps in an enclosure of the sealing projection on the direct bonding of the projection to the substrate, and, if necessary, the device can be directly molded in the covering material such as solder, silver paste or other suitable resin.

One of the semiconductor of the advantages of this invention lies in that any other means for encapsulation used conventionally for hermetic sealing can be eliminated. Eventually this results in a substantial reduction in both material and fabricating costs, and in increased ease of manufacture of reliable integrated circuit devices.

Furthermore, it is easy to provide an electrical connection to an outer circuit from the back face of the semiconductor device of the invention, if the covering material is made of an electrically conductive material.

In addition by simply using a high-heat-conductive material such as solder or silver paste as the covering material, an effective heat sink can be provided. This advantage makes possible the manufacture of large-scale integrated circuits.

Figure 1B:
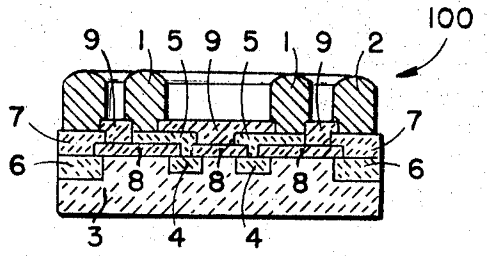

Now features and objects of this invention will become more apparent from a detailed description of preferred embodiments of this invention taken in conjunction with the accompanying drawings, in which:

FIG. 1-*a* is a plan view of a self-sealing semiconductor device, according to a first embodiment of this invention;

FIG. 1-*b* is a cross-sectional view taken along the line A—A′ of FIG. 1-*a;*

Figure 2A:
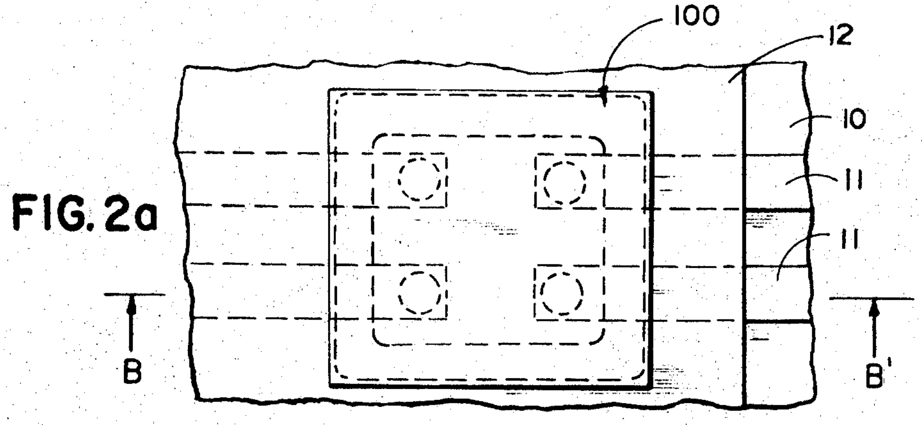
Figure 2B:
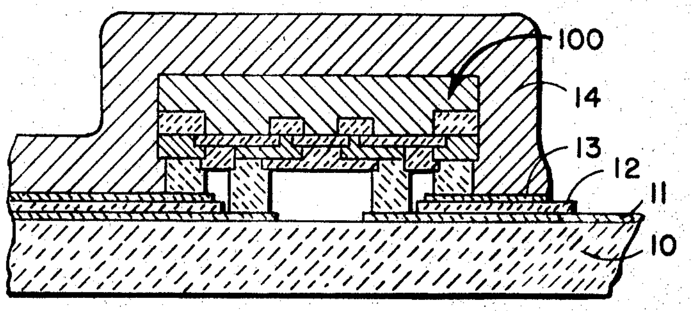

FIG. 2-*a* is a plan view of the semiconductor device shown in FIGS. 1-*a* and 1-*b* as face-down bonded onto a ceramic substrate;

FIG. 2-*b* is a cross-sectional view taken along the line B—B′ of FIG. 2-*a;*

Figure 3A:
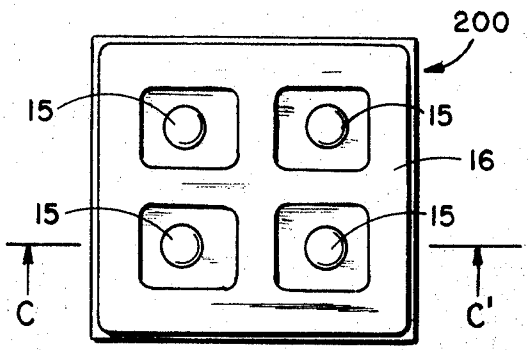
Figure 3B:
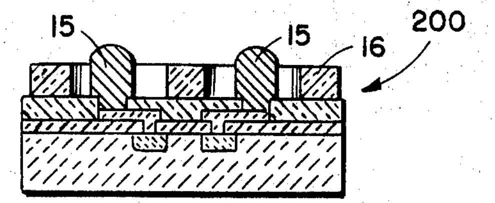

FIG. 3-*a* is a plan view of a self sealing semiconductor device of another embodiment of this invention;

FIG. 3-*b* is a cross-sectional view taken along the line C—C′ of FIG. 3-*a;*

Figure 4A:
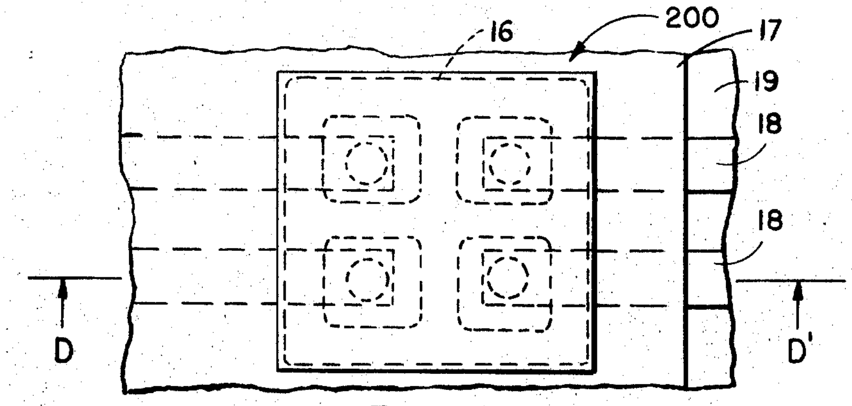
Figure 4B:
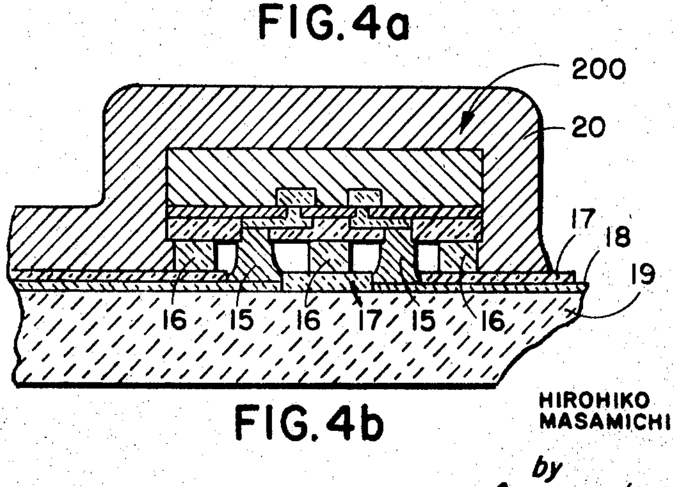

FIG. 4-*a* is a plan view of the semiconductor device shown in FIGS. 3-*a* and 3-*b* as face-down bonded onto a ceramic substrate; and FIG. 4-*b* is a cross-sectional view taken along the line D—D′ of FIG. 3-*a*.

Referring to FIGS. 1-*a* and 1-*b*, there is shown a semiconductor device generally designated 100 of a first embodiment of this invention, consisting essentially of an N type silicon substrate 3 having P type regions 4 formed thereon. A plurality of electrode bumps 1 are provided on the major surface of the silicon substrate 3 and are connected to respective P type regions 4, and a sealing projection 2 made of aluminum and disposed at the edge of the major surface of substrate 3 so as to surround the electrode bumps 1. The P type regions 4 are formed in substrate 3 by diffusing a P type impurity. In view of the necessity of providing electrical connection to the back face of the device 100, the metallic sealing projection 2 is preferably designed to make an ohmic contact with the silicon substrate 3. For this purpose, it is desirable that a high impurity diffusion region 6 of the same conductivity type as the N type silicon substrate 3 be formed in the substrate 3 and aluminum be evaporated thereon to form an electrode 7 simultaneously with the formation of the aluminum electrode 5. The electrodes 5 and 7 are isolated by a silicon oxide film 8 from substrate 3, except for the contact portions with the diffused regions 4 and 6.

A detailed description of the manufacturing procedure up to the formation of metallic electrodes 5 and 7 is omitted herein for simplicity, because it belongs to the well-established and well-known fabrication technique for the manufacture of semiconductor devices.

After the formation of metallic electrodes 5 and 7, a silicon oxide layer or film 9 is deposited onto the surface of the wafer by a low-temperature growth technique. Portions of the silicon oxide layer 9 corresponding to the locations at which the electrode bumps 1 and a sealing projection 2 are to be formed are etched away by the photoetching technique. Chromium and gold are then evaporated in succession and are etched away by a photoetching technique, leaving those portions corresponding to the locations of the electrode bumps and the sealing projection. This is followed by the formation of suitably shaped electrode bumps 1 and sealing projection 2 as shown in FIG. 1 by applying gold plating using the silicon substrate 3 as an electrode.

The finished silicon wafer is then cut into individual devices, each as shown in FIG. 1-*a* and FIG. 1-*b*.

Although the electrode bumps 1 and sealing projection 2 are made of gold in this embodiment, they may, for example, be made of silver, tin, lead or alloys of two or more of gold, silver, tin and lead.

Referring now to FIG. 2-*a* and FIG. 2-*b*, there is illustrated a preferred manner by which the semiconductor device 100 shown in FIG. 1-*a* and FIG. 1-*b* may be face-down bonded onto a ceramic substrate 10. A first Ti-Au metallized layer 11, a glass or silicon dioxide insulating layer 12, and a second Ti-Au metallized layer 13 are deposited in this order on the surface of the ceramic substrate 10. The device 100 is placed on the substrate 10 upside down, and the bumps 1 and the projection 2 are directly bonded to the metallized layers 11 and 13, respectively, such as by applying ultrasonic vibration to the bonding portions at a temperature of about 300° C. Accordingly, an outstanding feature of the self sealing semiconductor device of this invention is that the major surface of the device which is susceptible to the atmosphere can be perfectly sealed in an enclosure of the sealing projection at a stroke of the bonding operation onto the ceramic substrate. The ceramic cap used conventionally for hermetic sealing of the device can be eliminated. Consequently, highly dense mounting of the devices on the substrate can be achieved.

The device 100 may have a sufficiently high reliability, as it is. In order to further insure the airtightness and mechanical rigidity, to improve the heat dissipation capabilities of the device, and to provide an electrode on the back face of the device, if necessary, the back side of the device 100 may be covered with a suitable electrically and thermally conductive material 14 such as solder or silver paste as shown in FIG. 2-*b*.

It has been practically impossible with the conventional face-down bonding semiconductor devices to cover the back surface of the device with such an electrically and thermally conductive material, because, if covered, the covering material would freely enter into the space between the electrode bumps and form short-circuits. For this reason, the conventional face-down bonding device could not find a favorable structures suited for large-scale integrated circuits.

Accordingly, another outstanding feature of the semiconductor device of this invention lies in that the electrical contact is formed on the back surface of the device without resorting to wiring, that the heat radiation is sufficiently high, and that the mechanical rigidity is unaffected.

Another preferred embodiment of this invention is shown in FIGS. 3-*a*, 3-*b* and FIGS. 4-*a* and 4-*b*. In this embodiment, a sealing projection 16 of the device 200 is made of an insulating material such as glass or silicon dioxide which surrounds the electrode bumps 15 individually.

Furthermore, in order to prevent the substrate surface from being destroyed as the device is being bonded and to insure thereby reliable electrical contact, the height of the electrode bumps 15 is made a little higher than that of the sealing projection 16.

Referring to FIG. 4-*a* and FIG. 4-*b*, there is illustrated the manner in which the semiconductor device 200 shown in FIG. 3 is facedown bonded onto the surface of ceramic substrate 19. The ceramic substrate 19 has metallized circuit patterns 18 and an insulative layer such as silicon dioxide 17 which covers a part of the metallized circuit patterns 18. It will be apparent that a reliable hermetic sealing can likewise be formed by bonding together the device 200 and the substrate 19 as in the case of the first embodiment.

If the sealing projection 16 are formed of a low-melting point glass, a reliable hermetic seal is achieved by a thermocompression bonding technique. The back side of the device 200 can be covered with a suitable metallic material 20 having high electrical and thermal conductivity such as solder and silver paste without fear of short-circuiting the interior electrode bumps 15. These advantages of the second embodiment permit the fabrication of an integrated circuit having improved heat dissipation, improved mechanical sturdiness, and the production of hermetic sealing at a stroke of the bonding operation as in the case of the first embodiment.

Any other suitable semiconductor material other than silicon, such as germanium or gallium arsenide may be used as the semiconductor substrate material. Furthermore, a few of the electrode bumps left unsurrounded by the sealing projection, if any, may be appropriated for some special function. For instance, one such electrode may be electrically connected to the sealing projection and used as a grounding terminal when required.

The aforementioned structures of the self-sealing semiconductor device and its bonding onto the substrate of the first and the manner of second preferred embodiments of this invention are described herein merely for purposes of example, and they should not be construed as limitations on the scope of this invention.

What is claimed is:

1. A self-sealing semiconductor device of the face-down bonding type comprising a semiconductor substrate, at least one circuit element formed in said substrate, a plurality of electrode bumps electrically connected to portions of one major surface of said semiconductor substrate, and a metal sealing projection formed on said major surface of uniform height and surrounding said electrode bumps.

2. The semiconductor device according to claim 1, wherein said sealing projection is disposed along the edge of the major face of said semiconductor substrate.

3. The semiconductor device according to claim 1, wherein said sealing projection is disposed along the edge and in the central portion of said major face of said semiconductor substrate to surround said electrode bumps individually.

4. The semiconductor device according to claim 1, wherein said sealing projection makes ohmic contact with said semiconductor substrate.

5. The semiconductor device according to claim 1, wherein the metal of said sealing projection is made of a metal selected from the group consisting of gold, silver, tin, lead or one of alloys of these metals.

6. In combination with the semiconductor device of claim 1, a ceramic substrate, a first conducting layer on said ceramic substrate and bonded to said electrode bumps, an insulating layer on said first conducting layer, and a second conducting layer on said insulating layer and bonded to said sealing projection.

7. The semiconductor device of claim 6, further comprising an electrically and thermally conductive material covering said semiconductor substrate and said second conducting layer.

8. The semiconductor device of claim 1, in which said electrode bumps are at substantially the same level as said sealing projection.

9. A self-sealing semiconductor device of the face-down bonding type comprising a semiconductor substrate including at least one P-N junction, an insulator layer covering the major surface of said semiconductor substrate and having at least one window formed therein, a metallic layer on said insulator layer, one end of said metallic layer being in contact with said semiconductor substrate via said window, at least one electrode bump of uniform height formed on said metallic layer, and a metal sealing projection surrounding said electrode bump.

10. The semiconductor device according to claim 9, wherein the metal of said sealing projection is made of a metal selected from the group consisting of gold, silver, tin, lead or one of alloys of these metals.

11. The semiconductor device of claim 9, in which said electrode bump extends above said surrounding sealing projection.

* * * * *

UNITED STATES PATENT OFFICE
CERTIFICATE OF CORRECTION

Patent No. 3,657,610 Dated April 18, 1972

Inventor(s) Hirohiko Yamamoto and Masamichi Shiraishi

It is certified that error appears in the above-identified patent and that said Letters Patent are hereby corrected as shown below:

Column 4, Claim 5, line 33, "made of a metal" should have been deleted.

Claim 10, line 60, "made of a metal" should have been deleted.

Signed and sealed this 22nd day of August 1972.

(SEAL)
Attest:

EDWARD M.FLETCHER,JR.
Attesting Officer

ROBERT GOTTSCHALK
Commissioner of Patents